United States Patent [19]

Schweitzer, Jr.

[11] Patent Number: 6,016,105
[45] Date of Patent: Jan. 18, 2000

[54] FAULT INDICATOR PROVIDING CONTACT CLOSURE AND LIGHT INDICATION ON FAULT DETECTION

[75] Inventor: Edmund O. Schweitzer, Jr., Northbrook, Ill.

[73] Assignee: E.O. Schweitzer Manufacturing Co., Inc., Mundelein, Ill.

[21] Appl. No.: 09/118,756

[22] Filed: Jul. 17, 1998

Related U.S. Application Data

[63] Continuation-in-part of application No. 09/070,224, Apr. 30, 1998, abandoned.

[51] Int. Cl.⁷ .................................................. G08B 21/00
[52] U.S. Cl. ...................... 340/664; 240/635; 240/691.6; 324/133; 324/419; 361/93
[58] Field of Search ..................................... 340/635, 664, 340/657, 691; 361/91–93; 324/133, 418, 419

[56] References Cited

U.S. PATENT DOCUMENTS

| | | | |
|---|---|---|---|
| 3,229,274 | 1/1966 | Riley et al. | 340/664 |
| 3,413,548 | 11/1968 | Schweitzer, Jr. | 324/133 |
| 3,708,724 | 1/1973 | Schweitzer | 361/75 |
| 3,866,197 | 2/1975 | Schweitzer | 340/651 |
| 3,876,911 | 4/1975 | Schweitzer | 361/102 |
| 3,974,446 | 8/1976 | Schweitzer | 324/133 |
| 4,165,528 | 8/1979 | Schweitzer, Jr. | 361/156 |
| 4,234,847 | 11/1980 | Schweitzer, Jr. | 324/146 |
| 4,424,512 | 1/1984 | Schweitzer, Jr. | 340/664 |
| 4,438,403 | 3/1984 | Schweitzer, Jr. | 324/133 |
| 4,686,518 | 8/1987 | Schweitzer, Jr. | 340/664 |
| 4,794,332 | 12/1988 | Schweitzer, Jr. | 324/133 |
| 4,795,982 | 1/1989 | Schweitzer, Jr. | 324/508 |
| 4,811,153 | 3/1989 | Sakatos | 361/88 |
| 5,008,651 | 4/1991 | Schweitzer, Jr. | 340/664 |
| 5,497,096 | 3/1996 | Banting | 324/555 |
| 5,811,896 | 9/1998 | Grad | 307/125 |

*Primary Examiner*—Daniel J. Wu
*Attorney, Agent, or Firm*—Lockwood, Alex, Fitzgibbon & Cummings

[57] ABSTRACT

A fault indicator for detecting the occurrence of a fault current in a monitored conductor and providing a contact closure and a light indication indicative thereof includes a rotatably mounted indicator flag. The flag is positioned in either a reset indicating or a fault indicating state by a four-pole magnetic pole piece, which is magnetized to an appropriate magnetic orientation by momentary application of a current to an actuator winding on the pole piece. A first magnetically actuated reed switch in an auxiliary magnetic circuit associated with a first pole of the magnetic pole piece and including the actuator winding and a first bias magnet closes upon occurrence of the fault current to connect an internal lithium battery to an LED visible from the exterior of the fault indicator housing. A second magnetically actuated reed switch associated with a second pole of the magnetic pole piece and including the actuator winding and a second bias magnet closes upon occurrence of the fault current for external signaling or control purposes.

18 Claims, 7 Drawing Sheets

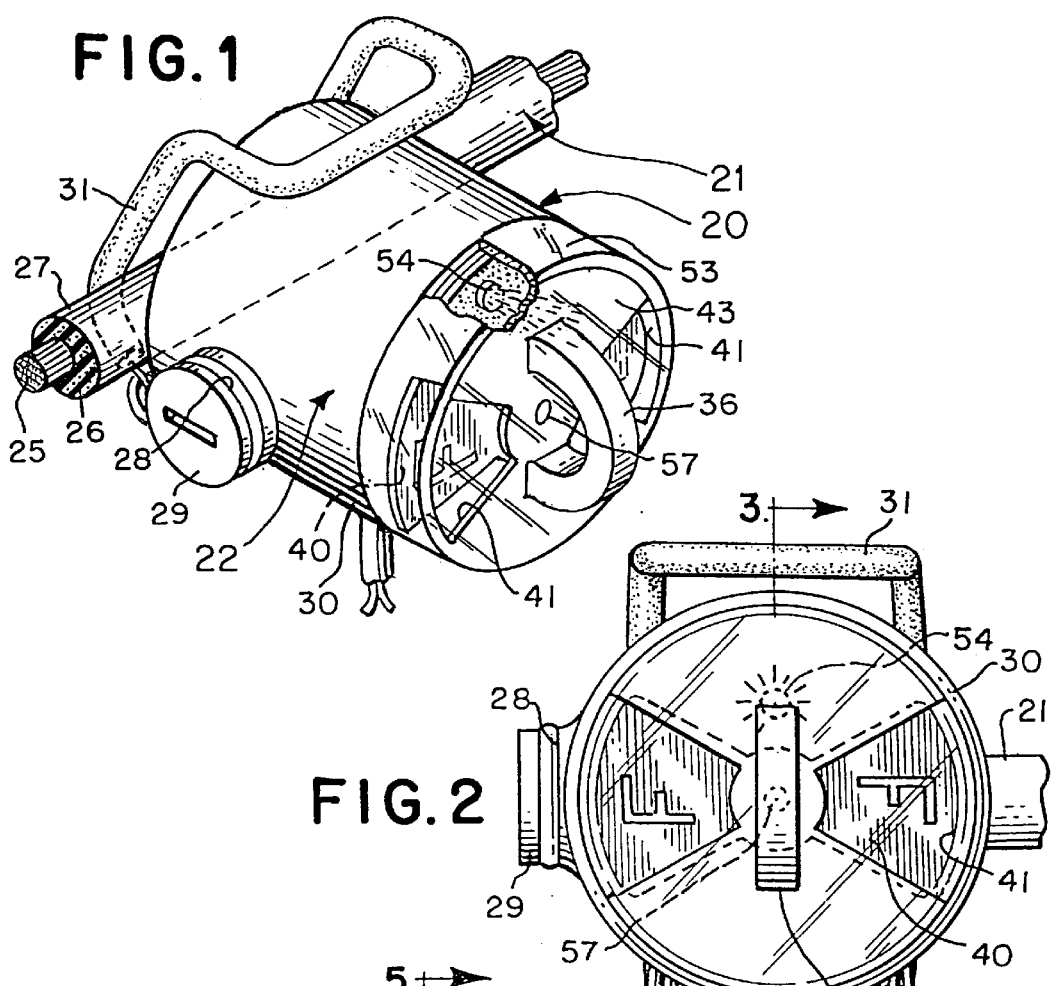
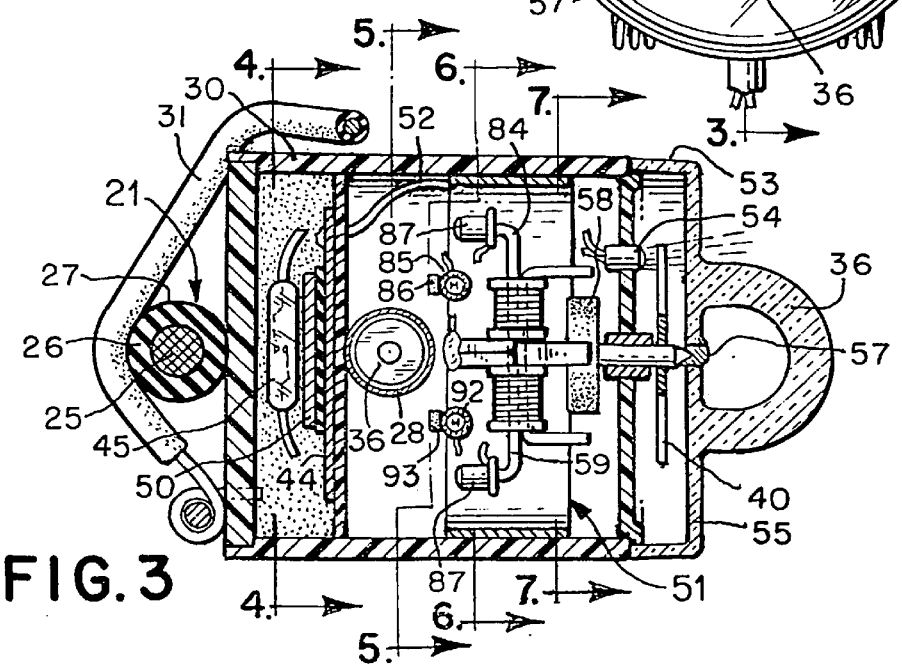

FAULT INDICATOR PROVIDING CONTACT CLOSURE AND LIGHT INDICATION ON FAULT DETECTION

This application is a Continuation-in-Part of application Ser. No. 09/070,224, filed Apr. 30, 1998, now abandoned.

BACKGROUND OF THE INVENTION

The present invention relates generally to current sensing devices for electrical systems, and more particularly to resettable alternating current fault indicators.

Various types of self-powered fault indicators have been constructed for detecting electrical faults in power distribution systems, including clamp-on type fault indicators, which clamp directly over cables in the systems and derive their operating power from inductive coupling to the monitored conductor, and test point type fault indicators, which are mounted over test points on cables or associated connectors of the systems and derive their operating power from capacitive coupling to the monitored conductor. Such fault indicators may be either of the manually reset type, wherein it is necessary that the indicators be physically reset, or of the self-resetting type, wherein the indicators are reset upon restoration of line current. Examples of such fault indicators are found in products manufactured by E.O. Schweitzer Manufacturing Company of Mundelein, Ill., and in U.S. Pat. Nos. 3,676,740, 3,906,477, 4,063,171, 4,234,847, 4,375,617, 4,438,403, 4,456,873, 4,458,198, 4,495,489, 4, 4,974,329, and 5,677,678 of the present inventor.

Detection of fault currents in fault indicators is typically accomplished by means of magnetic switch means such as a magnetic reed switch in close proximity to the conductor being monitored. Upon occurrence of an abnormally high fault-associated magnetic field around the conductor, the magnetic switch actuates a trip circuit which produces current flow in a trip winding to position an indicator flag visible from the exterior of the indicator to a trip or fault indicating position. Upon restoration of current in the conductor, a reset circuit is actuated to produce current flow in a reset winding to reposition the target indicator to a reset or non-fault indicating position.

In certain applications, such as where the fault indicator is installed in a dark or inaccessible location, the need arises for a light indication in addition to the flag indication. Repair crews can then more easily find the location of the fault.

In certain of these applications the need also arises for auxiliary contacts in the fault indicator for indicating or recording the detection of a fault current at a location remote from the fault indicator. For example, where fault indicators are installed in each of multiple distribution circuits fed from a common source, it may be desirable to monitor the fault indicators at a central monitoring facility to enable a fault to be quickly isolated. Repair crews can then be efficiently designated to the known location of the fault.

Because of the compact construction and limited power available in self-powered fault indicators it is preferable that the light indication be provided with minimal additional circuitry and structure within the fault indicator while providing reliable and extended operation following occurrence of a fault. The present invention is directed to a novel fault indicator light and auxiliary contact circuit which meets the above requirements by utilizing a magnetic winding, such as the actuator winding of the electromechanical indicator flag assembly typically utilized in fault indicators, in conjunction with a magnetic circuit to connect an internal battery upon occurrence of a fault.

Accordingly, it is a general object of the present invention to provide a new and improved fault indicator having a light indication and contact closure indicative fault occurrence.

It is a more specific object of the present invention to provide a new and improved self-powered fault indicator which provides a light indication and contact closure for an extended period of time following occurrence of a fault current in a monitored conductor.

It is a still more specific object of the present invention to provide a fault indicator wherein a light-indication and contact closure are provided utilizing the electro-magnetic flag indicator assembly of the fault indicator in conjunction with an internal battery.

SUMMARY OF THE INVENTION

The invention is directed to a fault indicator for indicating the occurrence of a fault current in an electrical conductor. The fault indicator comprises a housing, a battery, a lamp operable from the battery and viewable from the exterior of the housing, a first magnetic circuit including a magnetic pole piece, a magnetically actuated switch and a bias magnet, the bias magnet having a magnetic polarity which opposes a magnetic field in the magnetic pole piece in one direction, and reenforces a magnetic field in the magnetic pole piece in the other direction, whereby the magnetically actuated switch is conditioned to open in response to a magnetic field in the one direction and closed in response to a magnetic field in the other direction, a magnetic circuit including a magnetic pole piece, a second magnetic actuated switch and a bias magnet, the bias magnet having a magnetic polarity which opposes a magnetic field in the magnetic pole piece in one direction, and reenforces a magnetic field in the magnetic pole piece in the other direction, means including a magnetic winding in magnetic communication with the magnetic pole pieces and responsive to the current in the monitored conductor for developing magnetic fields in the magnetic pole pieces in the one direction to condition the switches open during normal current flow in the monitored conductor, and for developing magnetic fields in the magnetic pole pieces in the opposite direction to condition the switches closed upon occurrence of a fault current in the conductor, the first magnetically actuated switch connecting the battery to the lamp whereby the lamp lights in the fault indicating state, and circuit means associated with the second magnetically actuated switch whereby the switch provides a contact closure for use in external signaling or control.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

FIG. 1 is a perspective view of an electric field powered clamp-on fault indicator constructed in accordance with the invention installed on a cable within a power distribution system.

FIG. 2 is a front view of the fault indicator of FIG. 1 showing the indicator flag and indicator light thereof.

FIG. 3 is a cross-sectional view of the fault indicator of FIGS. 1 and 2 taken along line 3—3 of FIG. 2.

DESCRIPTION OF THE PREFERRED EMBODIMENT

Figure 4:
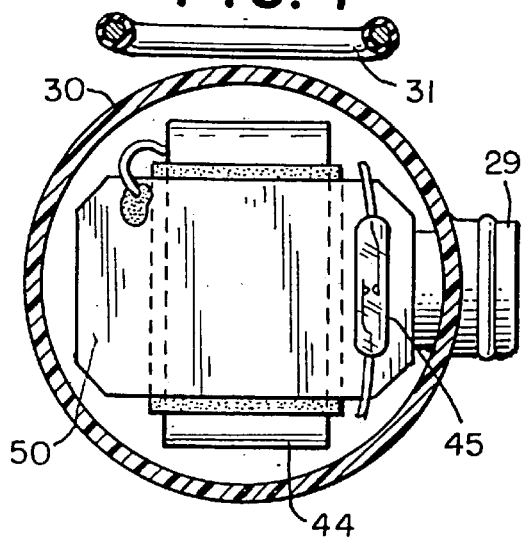
FIG. 4 is a cross-sectional view of the fault indicator of FIGS. 1–3 taken along line 4—4 of FIG. 3.

Referring to the Figures, and particularly to FIG. 1, a clamp-on electric field powered current-reset fault indicator 20 constructed in accordance with the invention for indicating fault currents in an electrical feeder or distribution cable 21 is seen to include a circuit module 22. In accordance with conventional practice, the circuit module is attached to the outer surface of cable 21, which may include a central conductor 25, a concentric insulating layer 26, and an electrically-grounded rubber outer sheath 27.

Figure 5:
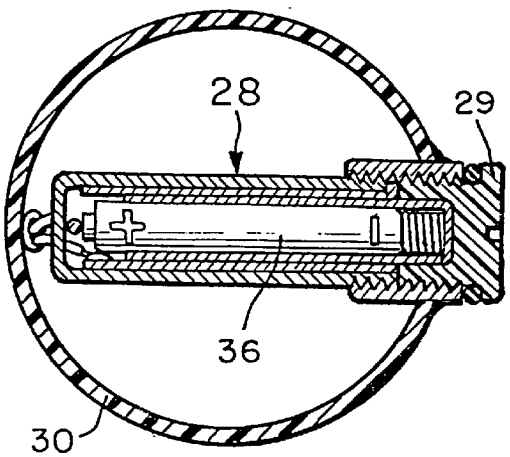
FIG. 5 is a cross-sectional view of the fault indicator of FIGS. 1–3 taken along line 5—5 of FIG. 3.
Figure 6:
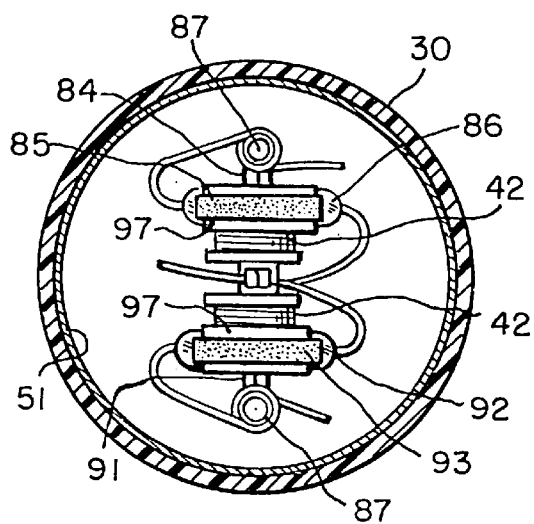
FIG. 6 is a cross-sectional view of the fault indicator of FIGS. 1–3 taken along line 6—6 of FIG. 3.
Figure 7:
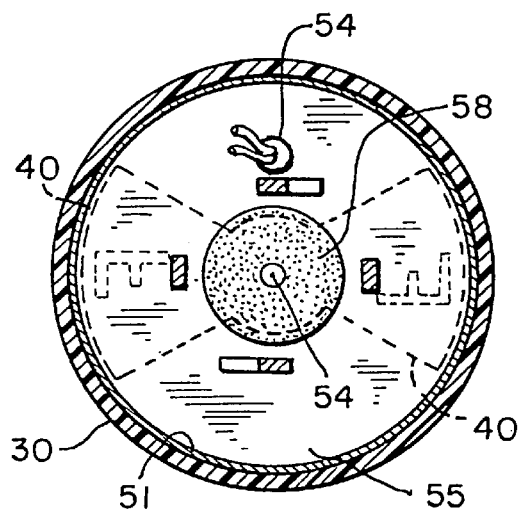
FIG. 7 is a cross-sectional view of the fault indicator of FIGS. 1–3 taken along line 7—7 of FIG. 3.
Figure 8:
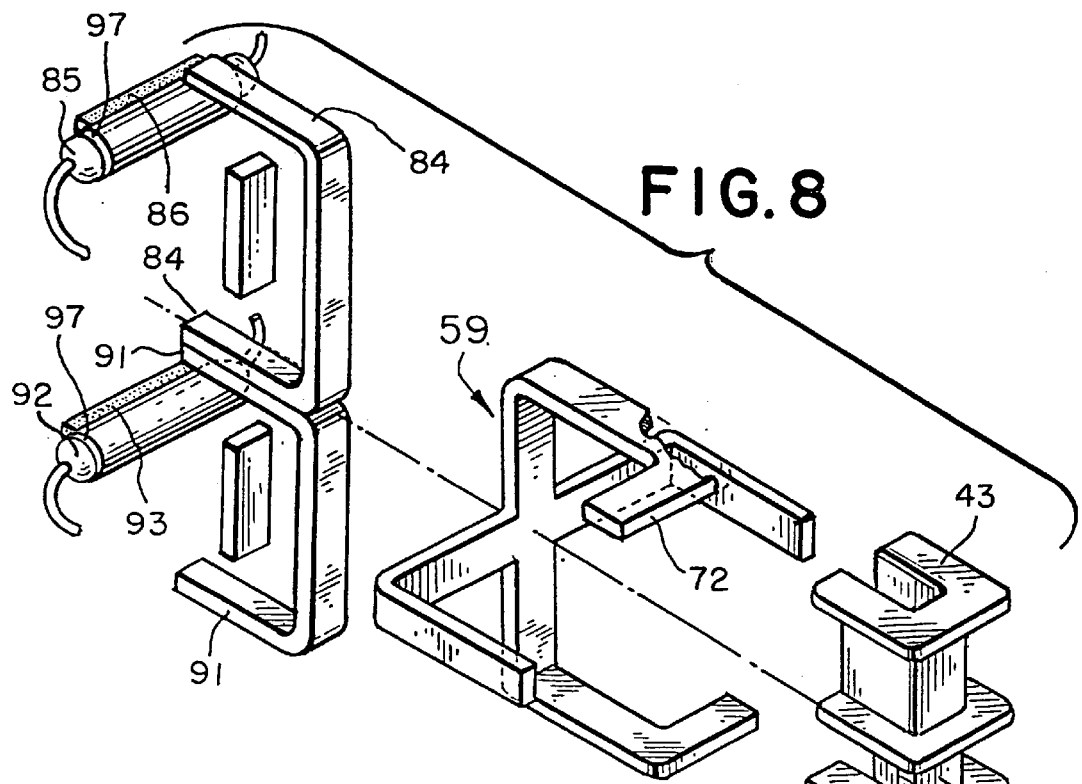
FIG. 8 is an exploded perspective view showing the principal components of the magnetic actuator of indicator flag assembly utilized in the fault indicator of FIGS. 1–4.
Figure 9:
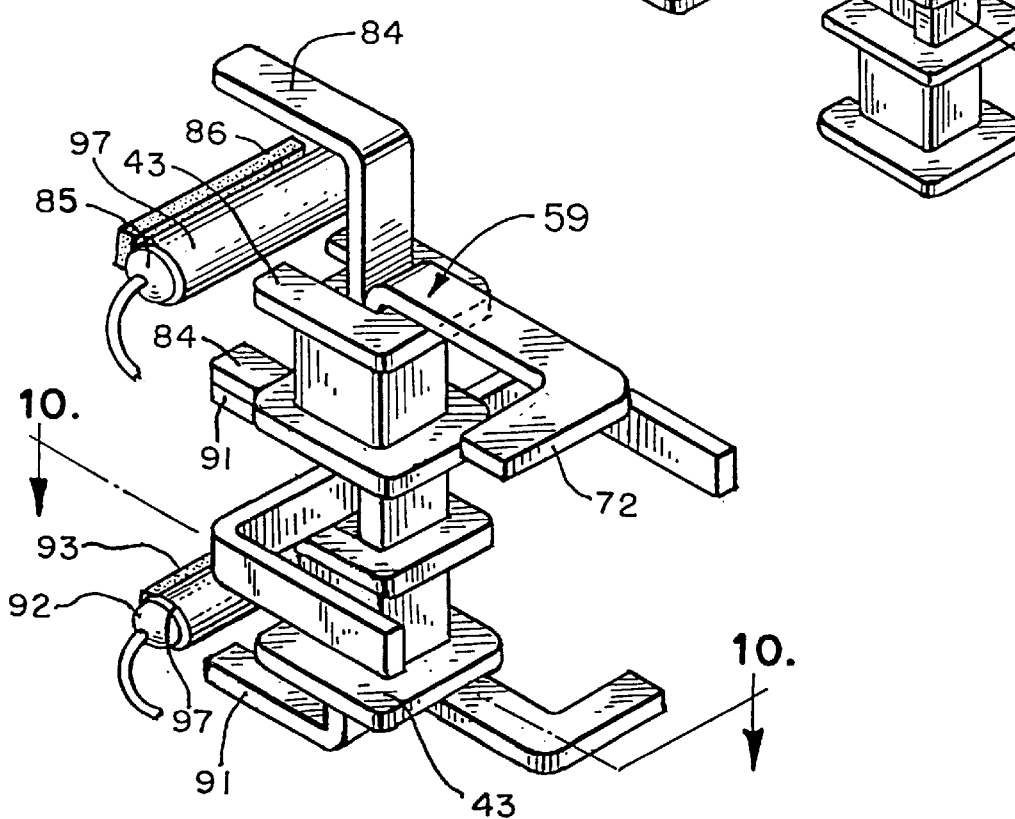
FIG. 9 is a perspective view of the assembled magnetic actuator of the indicator flag assembly.
Figure 10:
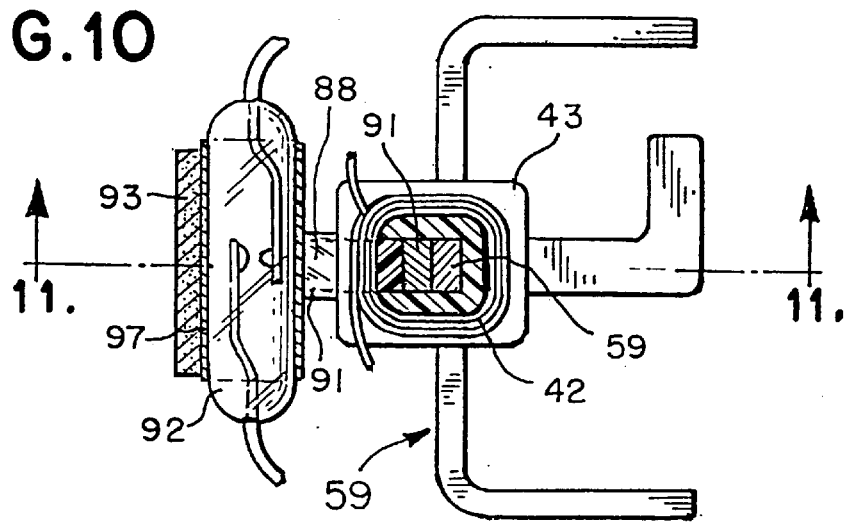
FIG. 10 is an enlarged cross-sectional view of the indicator flag assembly taken along line 10—10 of FIG. 9.

Basically, circuit module 22 includes a housing 30 (FIG. 2) within which circuitry for sensing fault currents is contained, and a clamp assembly 31 for attaching the module to a monitored conductor (such as cable 21) and for providing sufficient electric field coupling to the conductor to power the circuitry of the circuit module. An eye 36 on housing 30 may be provided to allow use of a conventional hotstick during installation or removal. A battery holder 28 within housing 30 includes a removable end cap 29 which provides access to a cylindrical battery compartment within which a battery 36 (FIG. 5) is contained.

The indicator circuit module 22 also includes, in accordance with conventional practice, a status-indicating flag 40 for indicating circuit status. The flag 40 may be viewed through a window 41 at the front of the indicator module. In operation, during normal current flow in conductor 21, indicator flag 40 is positioned by circuitry in circuit module 22 so as to be out of view. Upon the occurrence of a fault current in the conductor, the indicator flag is repositioned by the circuitry so as to present a red or fault-indicator surface for view through windows on the front face of the module. The fault indicator circuit includes an actuator winding 42 wound on bobbins 43 to provide the required magnetic force.

Within housing 30 components of the fault indicator are mounted a circuit board 44. These components include a magnetic reed switch 45, which is positioned with its axis perpendicular to and spaced from the axis of conductor 21 so as to respond to fault currents in the conductor in a manner well known to the art.

To provide a first electrostatic point to the electric field surrounding conductor 25 fault indicator 20 includes a flat metallic plate 50 immediately behind circuit board 44.

To provide a second pickup point to the electric field, fault indicator 20 includes on the inside surface of the cylindrical housing 30 an electrically conductive band 51 formed of a metallic material such as brass or steel. Where additional magnetic shielding is required for the components of the indicator steel is the preferred material for band 51, since it provides a significant degree of magnetic shielding. The band, which extends around a substantial portion of the inside circumference of housing 30, is connected to the circuitry of the fault indicator by a flexible conductor 52. Beneath band 51 the inside surface of housing 30 may be provided with an electrically-conductive coating which extends rearwardly of the ring, and forwardly of the ring, to provide a greater degree of electrostatic coupling.

The projecting end of housing 30 includes a transparent section 53 through which an internal signal lamp 54 can be viewed. Within housing 30 an integral partition 55 (FIG. 3) serves as a mask and spacing element and a support for lamp 54, and a transparent end cap sonically welded to the end of the housing seals the interior against contamination while providing the viewing windows 41 (FIG. 1).

To provide an indication of the occurrence of a fault current, the indicator module includes within the lower end of housing 30 the indicator flag 40 mounted for rotation about a pivot axis 57. As best seen in FIGS. 13–16, target indicator 40 has a red face, which is only visible through window 41 following occurrence of a fault.

Secured to and pivotal with indicator flag 40 is a flag actuator magnet 58 which is formed of a magnetic material having a high coercive force, such as ceramic, and is magnetically polarized to form four magnetic poles of opposite polarity, as indicated in FIGS. 13–16, with like magnetic polarities along diameters of the magnet.

A four pole pole piece 59, which is preferably formed of a magnetic material having a relatively low coercive force, such as chrome steel, is positioned in magnetic communication with flag actuator magnet 58.

Energization of winding 42 by current in one direction upon occurrence of a fault current in conductor 21, and energization of winding 42 by current in the opposite direction upon restoration of current in conductor 21, is accomplished by means of circuitry contained within circuit module 22.

Figure 12:
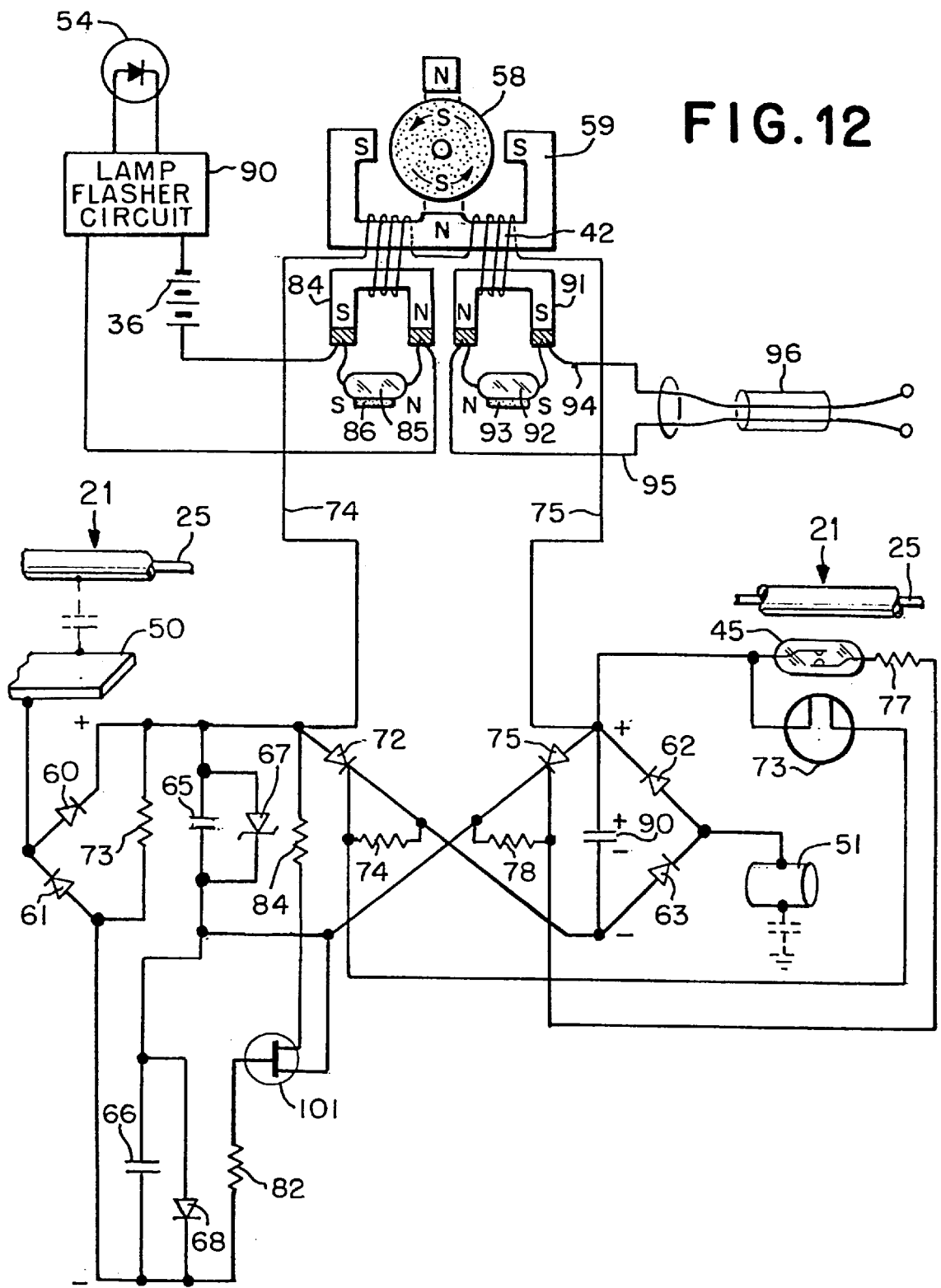
FIG. 12 is an electrical schematic diagram of the circuitry of the fault indicator shown in FIGS. 1–7.

Referring to FIG. 12, the circuitry of fault indicator 20 is seen to comprise a first rectifier network comprising a pair of rectifier diodes 60 and 61 connected to the capacitive pickup plate 50. A second rectifier network comprising a pair of rectifier diodes 62 and 63 is connected to the electrically conductive ring 51 and electrically conductive coating provided on the inside surface of housing 30 to provide a capacitive coupling to ground. Together, the two rectifier networks provide high input impedance rectification of the alternating current derived from the electric field surrounding the monitored conductor 25 of cable 21 by the two radially-spaced electrostatic pickup points to provide energization of the trip, reset and trip inhibit circuits of fault indicator 20.

The pulsating direct current developed by diodes 60 and 61 during normal current flow in conductor 25 is applied to a trip capacitor 66 and a trip inhibit capacitor 66 connected in series across the output terminals of the network. A zener diode 67 connected across trip capacitor 65 limits the voltage developed across that capacitor to the threshold voltage of the zener diode, typically in the order of 50 volts, and a forward-biased diode 68 connected across trip inhibit capacitor 66 limits the voltage developed across that device during the discharge cycle of the forward drop of the diode, typically in the order of 0.07 voltage. The pulsating direct current developed by diodes 62 and 63 is applied to a reset capacitor 70 connected across the output of the second rectifier network, causing that capacitor to also be charged during normal current flow.

To provide for periodic reset of the fault indicator capacitor 70 is periodically discharged through the series-connected windings 42 of the flag indicator assembly. To this end, a silicon controlled rectifier 72 is periodically conditioned into conduction by the discharge of a neon lamp 73 in the gate circuit of the SCR upon the voltage across capacitor 70 exceeding a predetermined threshold level. The neon lamp, because of its relatively high threshold, typically in the order of 60 volts, is particularly attractive as a threshold device. However, it will be appreciated that where desired other avalanche type devices, such as four-layer diodes can be provided for this purpose. A resistor 74 completes the gate circuit.

Following the discharge of reset capacitor 70 through winding 42, the voltage across the capacitor drops, neon lamp 73 extinguishes, and SCR 92 ceases to conduct. Capacitor 70 then begins to recharge until the voltage the across reset capacitor 70 again reaches the threshold level of neon lamp 73 and conduction through SCR 72 accomplishes another reset cycle. The repetition rate of the reset cycle is dependent on the capacitance of reset capacitor 60 and the effective impedance of the charging circuit. In practice, the reset cycle may occur approximately every 2 minutes.

Upon occurrence of a fault current in conductor 25, trip capacitor 65 is caused to discharge in a reverse direction through winding 42 through a second silicon controlled rectifier (SCR) 75. This results from closure of reed switch contacts 45, which are positioned in close magnetic proximity to cable 21 and connected to the gate electrode of SCR 75 through a gate circuit comprising a series resistor 77 and a resistor 78.

Trip capacitor 65 continues to discharge until the discharge current is no longer sufficient to maintain conduction through SCR 75. Magnetic pole piece 59 of the flag indicator assembly however remains in a magnetic polarity which maintains the indicator flag 40 in a fault indicating position. Upon restoration of normal current in conductor 25 it remains for the reset circuit of reset capacitor 70 to remagnetize pole piece 59 so as to reposition flag indicator 40 to a reset-indicting position.

To prevent false fault indications by fault indicator 20 as a result of inrush current associated with initial power-up of the monitored conductor 25, the fault indicator includes the trip inhibit capacitor 66 and its associated inhibit circuitry for discharging trip capacitor 65 upon such initial power-up. In particular, the control electrodes of an enhanced FET-type transistor 71 are connected across trip inhibit capacitor 66 through a resistor 82. During normal operation the forward-bias of diode 67 present across capacitor 86 constitutes a reverse bias to transistor 81 which biases the transistor into cut-off. Upon loss of excitation trip capacitor 65 is caused to partially discharge through a resistor 73 into trip inhibit capacitor 66, causing the voltage across that device to reverse polarity and progressively increase in the reverse direction as the device is charged. Eventually the threshold voltage of transistor 81 is reached and the transistor is rendered conductive by the applied forward bias from capacitor 66, causing trip capacitor 65 to rapidly discharge through a resistor 104 and therefore be unavailable for providing trip current to winding 42 upon conduction by SCR 75. Thus, after loss of voltage in conductor 25 the fault indicator is non- responsive to a fault current which occurs following the restoration of power in conductor 25, and does not become operative for this purpose until capacitor 65 has again been charged. This may in practice require several minutes.

The time required for the fault indicator to respond to a voltage loss depends on the relative capacitances of capacitors 65 and 66, the resistance of the resistor 73, and the threshold voltage level of transistor 81, which may typically be in the order of 3.5 volts. Typically, a response time of 0.1 second is obtained, corresponding to approximately 6 alternating current cycles in a standard 60 hertz system.

The operation of the indicator flag assembly is illustrated in FIG. 13–16. The indicator, which may be identical in construction and operation to that described in U.S. Pat. No. 4,495,489 of the present inventor, is seen to include the indicator flag 40, actuator magnet 58, pole piece 59 and winding 42. The indicator flag includes two indicator segments on either side of the axis of rotation which preferably each extend less than 90° around the axis of rotation.

Figure 13A:
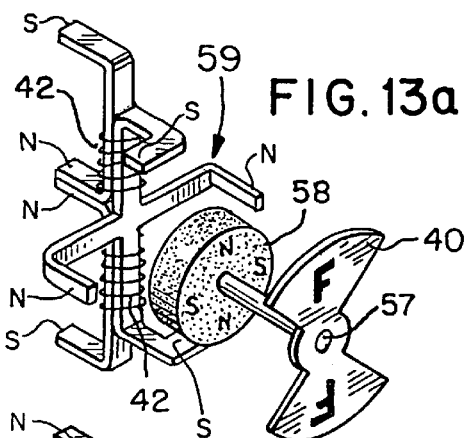
FIGS. 13A and 13B are diagrammatic views of the principal components of the indicator flag assembly of the fault indicator in a reset indicating position.
Figure 13B:
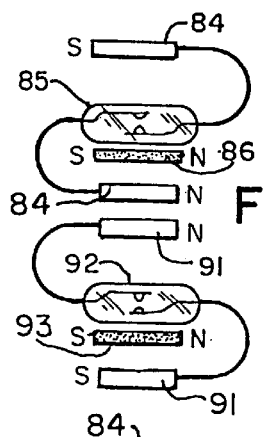
Figure 15A:
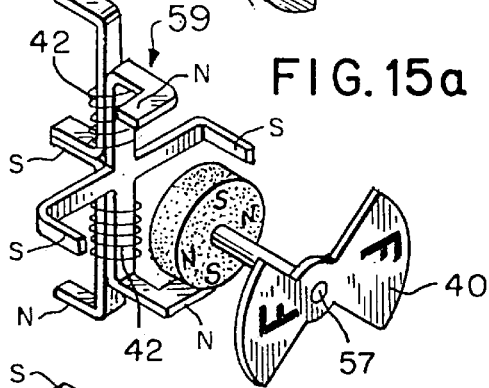
FIGS. 15A and 15B are diagrammatic views similar to FIGS. 13A and 13B, respectively, showing the principal components of the indicator flag assembly in a fault indicating position.
Figure 15B:
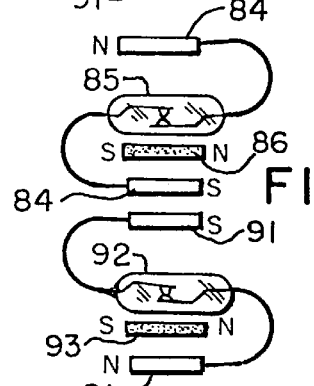

When aligned as shown in FIGS. 13A–13B the flag segments are masked and are not visible to the observer through windows 41. However, upon occurrence of a fault current, flag member 40 rotates 90° such that the indicator segments are positioned as shown in FIGS. 15A and 15B and are visible through the windows. The indicator segments are preferably colored red, or another highly visible color, to clearly indicate the occurrence of a fault current when viewed through the windows.

Actuation of flag member 40 between reset and fault indicating positions is accomplished by flag actuator magnet 58 which is rotatably coupled to the flag member by a shaft. The shaft is maintained in alignment with the axis of indicator housing 30 by means of bearing surfaces in divider wall 55, which also provides a reset-indicating surface viewable through windows 41, when the indicator flag is in its reset position. This surface is preferably colored white, or some other color contrasting with the color of the indicator flag segments, to clearly indicate a reset condition when viewed through the windows.

Actuator magnet 58, which may be formed of a magnetic material having a high coercive force, such as ceramic, is formed to provide four magnetic poles of opposite polarity, with opposite polarities at 90° about the circumference of the magnet. Actuator magnet 58 and hence indicator flag 40, are biased to the position and magnetic polarities shown in FIGS. 13A and 13B when the fault indicator 20 is in a non-trip or reset condition by means of a generally crossshaped magnetic pole piece 59 formed of a magnetic material having a relatively low coercive force, such as chrome steel. The pole piece includes four magnetic poles in magnetic communication with flag actuator 58.

Upon loss of voltage in conductor 25 pole piece 68 is remagnetized to the magnetic polarities shown in FIGS. 14A–14B and 15A–15B by momentary energization of magnetic winding 42. As a result, the poles of flag actuator magnet 58 are repelled by adjacent like-polarity poles of the pole piece and the indicator flag is caused to rotate 90° to the indicating position shown in FIGS. 15A–15B. In this position, the red indicator segments of the indicator flag 40 are visible through windows 41 and a lineman viewing the fault indicator is advised that a fault current has occurred in conductor 25.

Figure 16A:
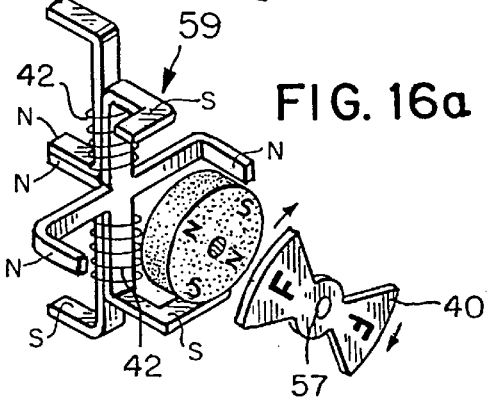
FIGS. 16A and 16B are diagrammatic views similar to FIGS. 13A and 13B, respectively, showing the principal components of the indicator flag assembly in transition between a fault indicating position and a reset indicating position.
Figure 16B:
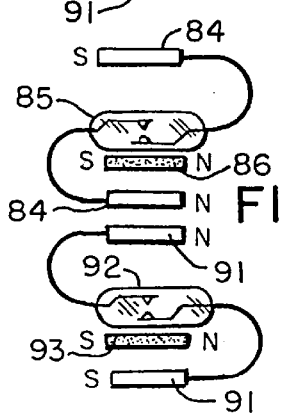

The indicator flag 40 remains in the fault-indicating position until the poles of pole piece 59 are subsequently remagnetized to the magnetic polarity shown in FIGS. 16A–16B by momentary application of a reset current to winding 42. This causes flag actuator magnet 58 to again be repelled by the adjacent poles of pole piece 59 so as to rotate indicator flag 40 to a vertical position, as shown in FIGS. 13A–13B.

By reason of the highly effective electrostatic coupling provided to the electric field surrounding conductor 21 by the combination of plate 44 and conductive coating 567, and the high input impedance of the fault indicator circuitry, sufficient voltage is derived from the potential gradient around the conductor to obviate the need for external grounding connections or electrically conductive ground plane members projecting from the housing.

Figure 11:
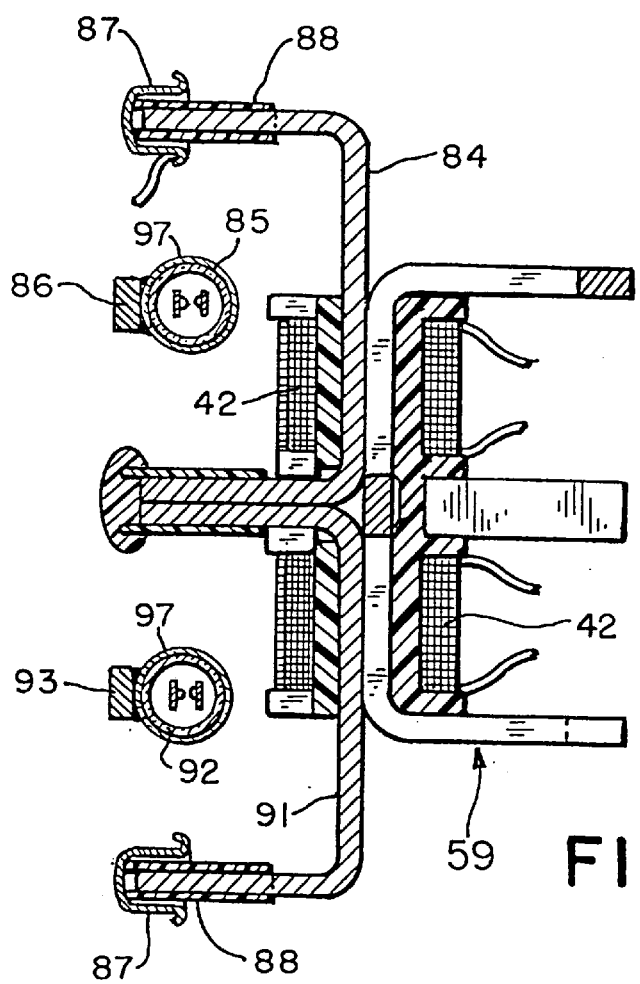
FIG. 11 is a cross-sectional view of the indicator flag assembly taken along line 11—11 of FIG. 10.

A contact closure for actuation of indicator lamp 54 is obtained in fault indicator 20 upon occurrence of a fault current in monitored conductor 21 by providing a first auxiliary magnetic circuit. In particular, and referring to FIGS. 3–9, the first magnetic circuit is formed by a first U-shaped magnetic pole piece 84, a reed switch 85 and a bias magnet 86. Pole piece 84, like pole piece 59, is preferably formed of a magnetic material having a relatively low coercive force, such as chrome steel. Winding 42 wraps around both pole piece 59 and pole piece 84, so that the direction of the magnetic field induced in both pole pieces is dependent on the direction of current in the winding. The lead wires of reed switch 85 are attached to the ends of pole piece 84 by metallic caps 87 (FIG. 11), to complete the magnetic circuit. To avoid a short circuit across the switch the lead wires are electrically isolated from the pole pieces by means of sleeves 88 formed of a vinyl or other non-electrically conductive material.

In operation, when fault indicator 20 is in a reset state with indicator flag 40 positioned as shown in FIG. 13A, and the magnetic circuit through reed switch 85 is as shown in FIG. 13B. In the absence of bias magnet 86 the magnetic field between the poles of pole piece 84 would cause the contacts of reed switch 85 to close. However, bias magnet 86 is polarized to oppose the magnetic poles as now polarized so that the field between the poles is sufficiently weakened so that the reed switch contacts do not close and no fault is signaled.

Figure 14A:
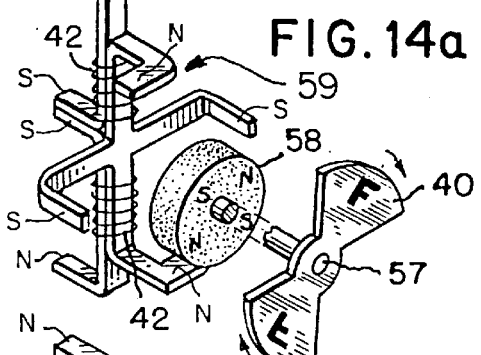
FIGS. 14A and 14B are diagrammatic views similar to FIGS. 13A and 13B, respectively, showing the principal components of the indicator flag assembly in transition between a reset indicating position and a fault indicating position.
Figure 14B:
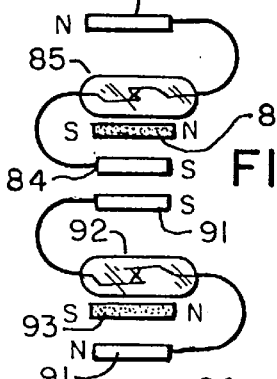

Upon occurrence of a fault, the polarity of the magnetic poles of pole piece 84 changes, as shown in FIGS. 14B and 15B. Magnet 86 now works to strengthen the magnetic field applied to the reed switch contacts, and the contacts close.

To prevent undesired actuation of reed switch 85 from the external magnetic field associated with conductor 25 the switch is preferably aligned with its axis generally parallel to the axis of the monitored conductor. With this alignment, to avoid actuation of the switch by the stray magnetic field of winding 42, the reed switch 85 may be contained within a cylindrical sleeve 89 of magnetically conductive material, such as copper, with bias magnetic 86 may be positioned on the outside surface of the sleeve with its axis parallel-spaced to the axis of the reed switch. However, where the monitored conductor is sufficiently spaced from the reed switch that the magnetic field of the conductor is not a factor, the reed switch can be aligned with its axis perpendicular to the axis of the actuator winding 42 as shown in FIG. 3 to minimize the effect of winding 42 on the reed switch. In this case the magnetic shield 89 may not be required.

The leads of reed switch 85 can be magnetically coupled to and electrically isolated from the magnetic poles of pole piece 110 by soldering or otherwise attaching the switch leads to the metallic caps 87 which are fitted over the sleeves 88.

A light indication of fault occurrence is obtained by connecting battery 36 through switch contacts 85 to a flasher circuit 90, which provides a flashing signal to signal lamp 54. Flasher circuit 90 is preferably a commercially available component adapted to power lamp 54, which is preferably a light emitting diode (LED).

With LED 54 positioned as shown behind flag 40, the light is viewable from the front of fault indicator 22, and from the sides of the fault indicator through the transparent end portion 53 of housing 30.

Figure 17:
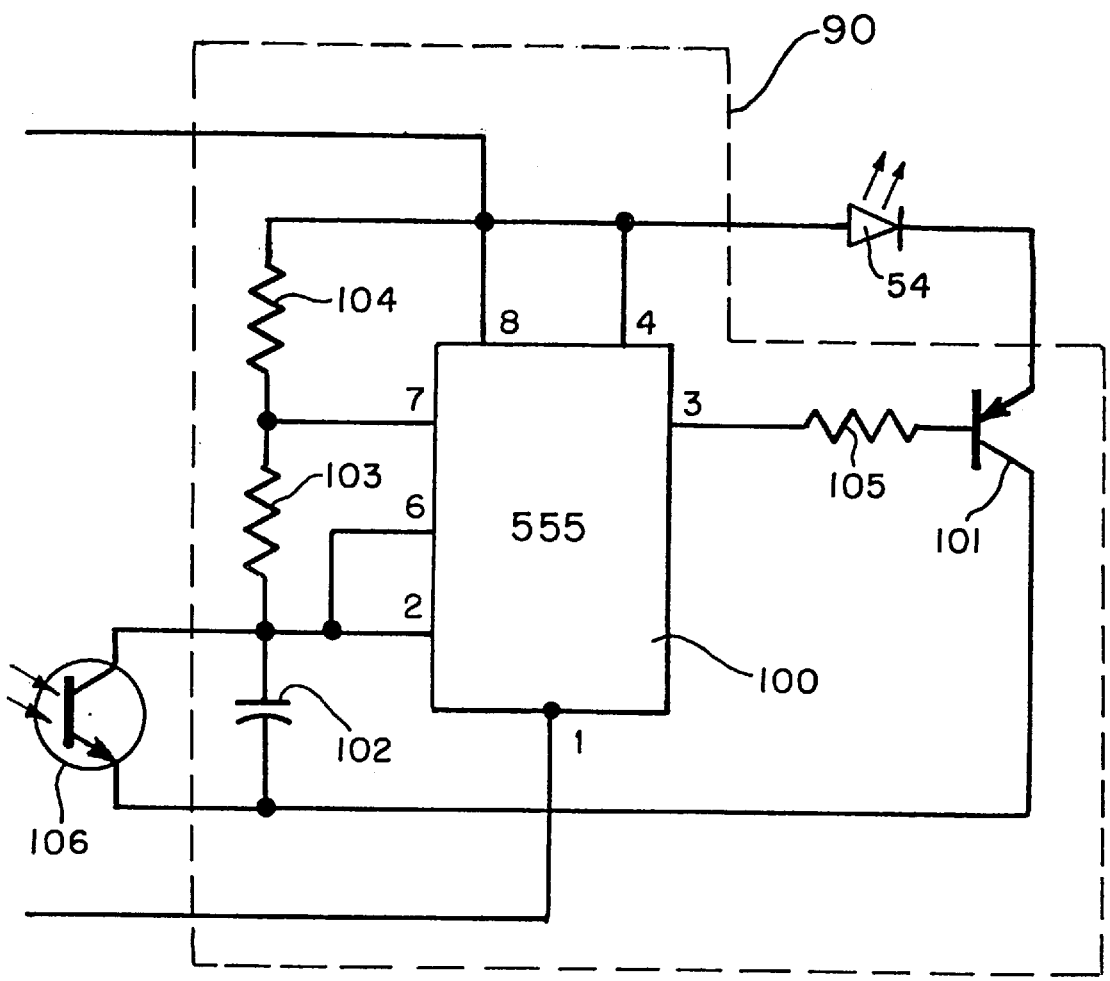
FIG. 17 shows a flasher circuit for use in the fault indicator of FIG. 1–16.

Battery 36 is preferably a thionyl chloride lithium battery, such as type TL-593-S manufactured by TADIRAN, Ltd. of Israel, which provides a constant 3.6 volt output to depletion. Flasher circuit 90 and LED 54 are preferably as shown in FIG. 17.

In accordance with the invention, a second auxiliary contact closure is obtained in fault indicator 20 for external signaling or contact purposes upon occurrence of a fault current in monitored conductor 25 by providing a second magnetic circuit in association with the indicator assembly. In particular, and referring again to FIGS. 3–9, the second magnetic circuit is formed by a second U-shaped magnetic pole piece 91, a reed switch 92 and a bias magnet 93. Pole piece 91, like pole pieces 59 and 84, is preferably formed of a magnetic material having a relatively low coercive force, such as chrome steel. Winding 42 wraps around both pole pieces 59 and 84 and pole piece 91, so that the direction of the magnetic field induced in all three pole pieces is dependent on the direction of current in the winding. The lead wires of reed switch 92 are attached to the ends of pole piece 91 by metal caps 87 and insulating sleeve 88 to complete the magnetic circuit without developing a short circuit across the switch. The caps are in turn connected by lead wires 94 and 95 of a cable 96 to an external location for signaling and/or control purposes.

In operation, when fault indicator 20 is in a reset state with indicator flag 40 positioned as shown in FIG. 13A, and the magnetic circuit through reed switch 92 is as shown in FIG. 13B. In the absence of bias magnet 93 the magnetic field between the poles of pole piece 91 would cause the contacts of reed switch 92 to close. However, bias magnet 93, like bias magnet 86, is polarized to oppose the magnetic poles as now polarized so that the field between the poles is sufficiently weakened so that the contacts of reed switch 92 do not close and no fault is signaled.

Upon occurrence of a fault, the polarity of the magnetic poles of pole piece 91 changes, as shown in FIGS. 14B and 15B, and magnet 93 works to strengthen the magnetic field applied to the reed switch contacts. The contacts now close, signaling a fault.

To prevent undesired actuation of reed switch 91 from the external magnetic field associated with conductor 25, the switch, like reed switch 85, is preferably aligned with its axis generally parallel to the axis of the monitored conductor. In this case, to avoid actuation of the switch by the stray magnetic field of winding 42, the reed switch 92 is preferably contained within a cylindrical sleeve 97 of magnetically conductive material, such as copper, with bias magnetic 93 being positioned on the outside surface of the sleeve with its axis parallel-spaced to the axis of the reed switch. However, where the monitored conductor is sufficiently spaced from the reed switch that the magnetic field of the conductor is not a factor, the reed switch can be aligned with its axis perpendicular to the axis of the actuator winding 42 as shown in FIG. 3 to minimize the effect of winding 42 on the reed switch. In this case the cylindrical magnetic shield 97 may not be required.

Referring to FIG. 17, LED 54 is caused to flash by flasher circuit 90, which includes a bistable multivibrator 100, such as a type 555 chip and a switching transistor 101. The multivibrator, which may be a type 555, switches states at a repetition rate dependent on capacitor and the series combination of resistors 103 and 104. The output of the multivibrator is connected to the base electrode of transistor 101 by a resistor, causing the transistor to alternate between conductive and non-conductive states, thereby flashing LED 54.

A photocell 106 may be optionally connected across capacitor 102 to suspend flashing during daylight hours, thereby increasing the life of battery 36.

It will be appreciated that while the auxiliary contact arrangement of the invention has been shown incorporated in a capacitively coupled electric field powered fault indicator, the inventive arrangement finds equal utility in inductively coupled current powered fault indicators.

Thus, a compact externally-powered fault indicator has been described which upon sensing of a fault current provides dual contact closures for lighting an internal lamp and for external signaling and control purposes. By utilizing the existing single electromechanical indicator flag assembly, a minimal number of additional components are required, making the device especially well suited for economically upgrading existing fault monitoring systems.

While a particular embodiment of the invention has been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. A fault indicator for indicating the occurrence of a fault current in an electrical conductor, comprising:

a housing;

a battery;

a lamp operable from said battery and viewable from the exterior of the housing;

a first magnetic circuit including a first magnetic pole piece, a first magnetically actuated switch and a first bias magnet, said bias magnet having a magnetic polarity which opposes a magnetic field in said magnetic pole piece in one direction, and reenforces a magnetic field in said magnetic pole piece in the other direction, whereby said magnetically actuated switch is conditioned to a reset indicating state in response to a magnetic field in said magnetic pole piece in said one direction and to a fault indicating state in response to a magnetic field in said magnetic pole piece in said other direction;

a second magnetic circuit including a second magnetic pole piece, a second magnetically actuated switch and a second bias magnet, said bias magnet having a magnetic polarity which opposes a magnetic field in said magnetic pole piece in one direction, and reenforces a magnetic field in said magnetic pole piece in the other direction, whereby said magnetically actuated switch is conditioned to a reset indicating state in response to a magnetic field in said one direction and to a fault indicating state in response to a magnetic field in said other direction;

circuit means including a magnetic winding in magnetic communication with said first and second magnetic pole pieces and responsive to the current in the monitored conductor for developing a magnetic field in said magnetic pole pieces in a direction to condition said first and second magnetically actuated switches to said reset indicating states during normal current flow in the monitored conductor, and for developing a magnetic field in said pole pieces in said opposite direction to condition said first and second magnetically actuated switches to said fault indicating states upon occurrence of a fault current in the conductor; and said first magnetically actuated switch connecting said battery to said lamp in said fault indicating state whereby said lamp lights in said fault indicating state; and said second magnetically actuated switch being connected to an external indicating or control circuit for remote indication of said reset and fault indicating states.

2. A fault indicator as defined in claim 1 wherein said first and second magnetic pole pieces each include a pair of spaced-apart magnetic poles, and said magnetically actuated switches are disposed between said poles.

3. A fault indicator as defined in claim 2 wherein said magnetically actuated switches each include a pair of projecting leads, and said leads are mechanically connected to but electrically isolated from said magnetic poles.

4. A fault indicator as defined in claim 3 wherein said magnetically actuated switches each comprises a reed switch.

5. A fault indicator as defined in claim 4 wherein the axis of said reed switches are aligned generally parallel to the axis of said monitored conductor.

6. A fault indicator as defined in claim 5 wherein said first and second magnetic pole pieces are each generally U-shaped.

7. A fault indicator for indicating the occurrence of a fault current in an electrical conductor, comprising:

a housing;

a battery;

a lamp operable from said battery and viewable from the exterior of said housing;

an indicator flag assembly comprising an indicator flag viewable from the exterior of the housing and a first magnetic circuit including a first magnetic pole piece, said indicator flag being magnetized and in magnetic communication with said first magnetic pole piece whereby said indicator flag is actuated to a reset-indicating position by a magnetic field in said first magnetic pole piece in one direction, and is actuated to a fault-indicating position by a magnetic field in said first magnetic pole piece in the opposite direction;

a second magnetic circuit including a second magnetic pole piece, a first magnetically actuated switch and a first bias magnet, said first bias magnet having a magnetic polarity which opposes a magnetic field in said second magnetic pole piece in one direction, and reenforces a magnetic field in said second magnetic pole piece in the other direction, whereby said first magnetically actuated switch is actuated to a reset indicating state in response to a magnetic field in said second magnetic pole piece in said one direction and is actuated to a fault indicating state in response to a magnetic field in said second magnetic pole piece in said other direction;

a third magnetic circuit including a third magnetic pole piece, a second magnetically actuated switch and a second bias magnet, said second bias magnet having a magnetic polarity which opposes a magnetic field in said second magnetic pole piece in one direction, and reenforces a magnetic field in said second magnetic pole piece in the other direction, whereby said magnetically actuated switch is actuated to a reset-indicating state in response to a magnetic field in said third magnetic pole piece in said one direction and to a fault-indicating state in response to a magnetic field in said third magnetic pole piece in said other direction;

circuit means including a magnetic winding in magnetic communication with said first, second and third magnetic pole pieces and responsive to the current in the monitored conductor for developing a magnetic field in said one direction in said pole pieces to position said indicator flag to said reset indicating position and condition said first magnetically actuated switch to said reset indicating state and to condition said second magnetically actuated switch to said reset indicating state during normal current flow in the monitored conductor, and for developing a magnetic field in said opposite direction in said first, second and third magnetic pole pieces to position said indicator flag in said fault indicating position and to condition said first and second magnetically actuated switches to said fault indicating states upon occurrence of a fault current in the conductor;

said first magnetically actuated switch connecting said battery to said lamp whereby said lamp lights when said first magnetically actuated switch is in said fault indicating state; and said second magnetically actuated switch being connected to an external indicating or control circuit.

8. A fault indicator as defined in claim 7 wherein said second and third magnetic pole pieces each include a pair of spaced-apart magnetic poles, and said magnetically actuated switches are each disposed between said poles.

9. A fault indicator as defined in claim 8 wherein said magnetically actuated switches each include a pair of projecting leads, and said leads are each mechanically connected to but electrically isolated from said magnetic poles.

10. A fault indicator as defined in claim 9 wherein said magnetically actuated switches each comprise a reed switch.

11. A fault indicator as defined in claim 10 wherein the axis of said reed switches are aligned generally parallel to the axis of said monitored conductor.

12. A fault indicator for indicating the occurrence of a fault current in an electrical conductor, comprising:

a housing;

a battery;

a lamp operable from said battery and viewable from the exterior of the housing;

a rotatably mounted indicator flag viewable from the exterior of said housing;

a first magnetic pole piece having magnetic poles in magnetic communication with said indicator flag, said flag assuming a reset-indicating position in response to a magnetic field in said first magnetic pole piece in one direction and a trip-indicating position in response to a magnetic field in said first magnetic pole piece in the other direction;

a first magnetically actuated switch;

a second magnetic pole piece having magnetic poles in magnetic communication with said first magnetically actuated switch, and a bias first magnet opposing a magnetic field in said second magnetic pole piece in said one direction and reenforcing a magnetic field in said second magnetic pole piece in said other direction whereby said first magnetically actuated switch is actuated to a reset indicating state in response to a magnetic field in said one direction and is actuated to a fault indicating state in response to a magnetic field in said second magnetic pole piece in said other direction;

a second magnetically actuated switch;

a third magnetic pole piece having magnetic poles in magnetic communication with said second magnetically actuated switch, and a second bias magnet opposing a magnetic field in said third magnetic pole piece in said one direction and reenforcing a magnetic field in said third magnetic pole piece in said other direction whereby said magnetically actuated switch is actuated to a reset indicating state in response to magnetic field in said third magnetic pole piece in said one direction and to a fault indicating state in response to a magnetic field in said third magnetic pole piece in said other direction;

circuit means including a magnetic actuator winding in magnetic communication with said first, second and third magnetic pole pieces for inducing magnetic fields in said one direction in each of said pole pieces when said fault indicator is in a reset state, and in said other direction when said fault indicator is in a trip state;

said first magnetically actuated switch connecting said battery to said lamp whereby said lamp lights in said fault indicating state, and said second magnetically actuated switch being connected to an external indicating or control circuit.

13. A fault indicator as defined in claim 12 wherein said second and third magnetic pole pieces each include a pair of spaced-apart magnetic poles, and said magnetically actuated switches are each disposed between said poles.

14. A fault indicator as defined in claim 13 wherein said magnetically actuated switches each include a pair of projecting leads, and said leads are mechanically connected to but electrically isolated from said magnetic poles.

15. A fault indicator as defined in claim 14 wherein said magnetically actuated switches each comprise a reed switch.

16. A fault indicator as defined in claim 15 wherein the axis of said reed switches are aligned generally parallel to the axis of said monitored conductor.

17. A fault indicator as defined in claims 12 wherein said second and third magnetic pole pieces are generally U-shaped.

18. A fault indicator as defined in claim 17 wherein said actuator winding is wound on the transverse portion of said second and third U-shaped magnetic pole pieces.

* * * * *